(12) United States Patent
Green et al.

(10) Patent No.: US 6,625,782 B1
(45) Date of Patent: Sep. 23, 2003

(54) SOFTWARE STRUCTURE METHODOLOGY DESCRIPTION OF PROGRAMMABLE PHASE-LOCKED LOOP DIE AND DEVICE PRESENTATION TECHNIQUES

(75) Inventors: David Green, Snohomish, WA (US); Chao Chen, Bothell, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 76 days.

(21) Appl. No.: 09/928,817

(22) Filed: Aug. 13, 2001

(51) Int. Cl.[7] .............................................. G06F 17/50
(52) U.S. Cl. ................................. 716/3; 716/3; 716/4
(58) Field of Search .............................. 716/3–4, 6, 8, 716/17; 326/39, 41

(56) References Cited

U.S. PATENT DOCUMENTS

| 4,689,740 A | 8/1987 | Moelands et al. ........... 364/200 |
| 5,559,502 A | 9/1996 | Schutte ................... 340/825.21 |
| 5,689,196 A | 11/1997 | Schutte ......................... 326/86 |
| 6,188,242 B1 * | 2/2001 | Mahajan et al. .............. 326/41 |

FOREIGN PATENT DOCUMENTS

| WO | WO 96/17305 | 6/1996 | ........... G06F/13/40 |
| WO | WO 98/34376 | 8/1998 | ........... H04L/12/20 |
| WO | WO 99/09712 | 2/1999 | ........... H04L/12/40 |

OTHER PUBLICATIONS

JEDEC Standard, "Standard Data Transfer Format Between Data Preparation System and Programmable Logic Device Programmer", JESD3–C (Revision of JESD3–B), Jun. 1994, pp. 1–35.

* cited by examiner

Primary Examiner—Matthew Smith
Assistant Examiner—Naum Levin
(74) Attorney, Agent, or Firm—Christopher P. Maiorana, P.C.

(57) ABSTRACT

A method for creating a specification for a device. The method may include the steps of (A) creating a base class having a first rule set for a programmable die, (B) filtering a definition for the device against a second rule set to present a result in response to creating, and (C) polymorphing the base class according to the result to present the specification for the device in response to filtering.

20 Claims, 3 Drawing Sheets

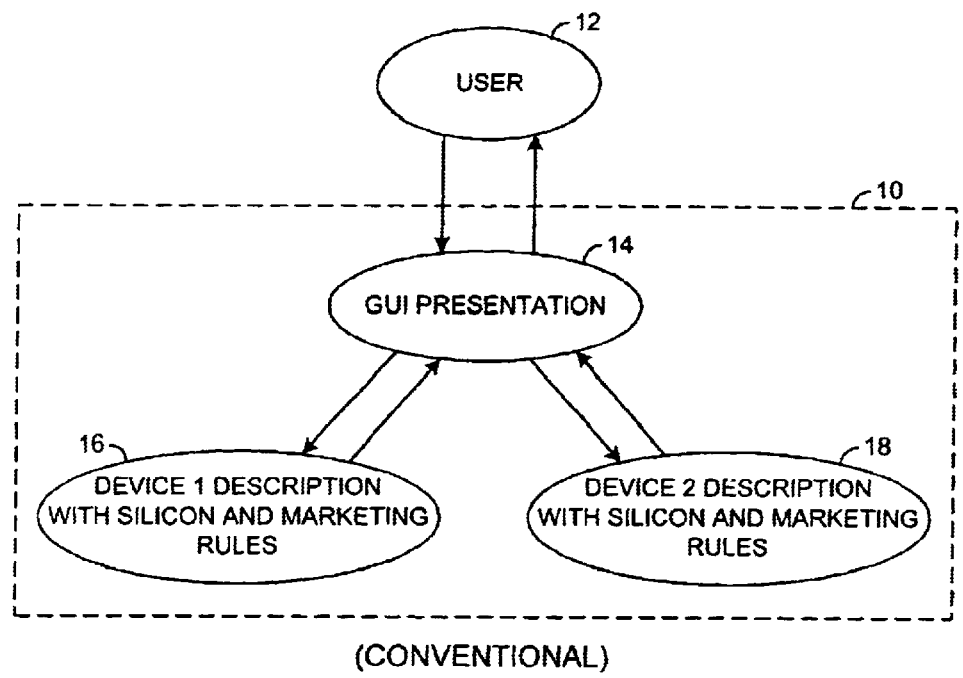
(CONVENTIONAL)
FIG. 1

SOFTWARE STRUCTURE METHODOLOGY DESCRIPTION OF PROGRAMMABLE PHASE-LOCKED LOOP DIE AND DEVICE PRESENTATION TECHNIQUES

FIELD OF THE INVENTION

The present invention relates to a method and/or architecture for specifying silicon device programming parameters generally and, more particularly, to a method and/or architecture for presenting a programmable die to appear to a user as a family of independent devices.

BACKGROUND OF THE INVENTION

Developing code for a programmable die to meet a customer's requirements for a new device currently takes a considerable amount of development time and money. The customer's requirements for the new device are matched with the capabilities of existing programmable die, marketing rules and constraints imposed by the vendor. The matching task commonly involves multiple software programs operating separately, or in combination, to define the new device. Consequently, a considerable amount of redundancy is encountered among the multiple software programs resulting in inefficiency. Translations of data among the various software programs also result in a high probability of error.

Referring to FIG. 1, a diagram illustrating conventional method 10 for developing a specification for the new device is shown. A user 12 provides a description of a first new device to a graphical user interface (GUI) presentation task 14. The GUI presentation task 14 relays the first new device description to a first processing task 16. The first processing task 16 includes a mixture of rules for (i) the silicon that is to become the first new device and (ii) marketing considerations. Once a datasheet type specification for the first new device is created, the first processing task 16 relays the specification information to the GUI presentation task 14 for display back to the user 12.

The user 12 commonly presents a description of a second new device to the GUI presentation task 14. The GUI presentation task 14 conveys the second new device description to a second processing task 18 to generate another datasheet type specification. The second processing task 18 contains a copy of the silicon rules and marketing rules used in the first processing task 16. Once a specification for the second new device is generated, the second processing task 18 relays the specification information to the GUI presentation task 14 for display to the user 12.

In situations where the user 12 creates a family of new devices, additional processing tasks (not shown) similar to the first and second processing tasks 16-18 are created, one for each additional new device. Each additional processing task contains a copy of the silicon rules and the marketing rules. As a result, a considerable amount of redundancy is involved in developing specifications for the family of new devices.

SUMMARY OF THE INVENTION

The present invention concerns a method for creating a specification for a device. The method may comprise the steps of (A) creating a base class having a first rule set for a programmable die, (B) filtering a definition for the device against a second rule set to present a result in response to creating, and (C) polymorphing the base class according to the result to present the specification for the device in response to filtering.

The objects, features and advantages of the present invention include providing a method and/or architecture for specifying silicon device programming parameters that may (i) present information to an end user in such a way as to develop a family of parts from a base die, (ii) be cost efficient, (iii) provide faster and more accurate code to market, (iv) support a growing family of devices with minimum development overhead and/or (v) reduce testing time.

BRIEF DESCRIPTION OF THE DRAWINGS

These and other objects, features and advantages of the present invention will be apparent from the following detailed description and the appended claims and drawings in which:

FIG. 1 is a diagram illustrating a conventional method for developing a new device;

DETAILED DESCRIPTION OF THE PREFERRED EMBODIMENTS

Figure 2:
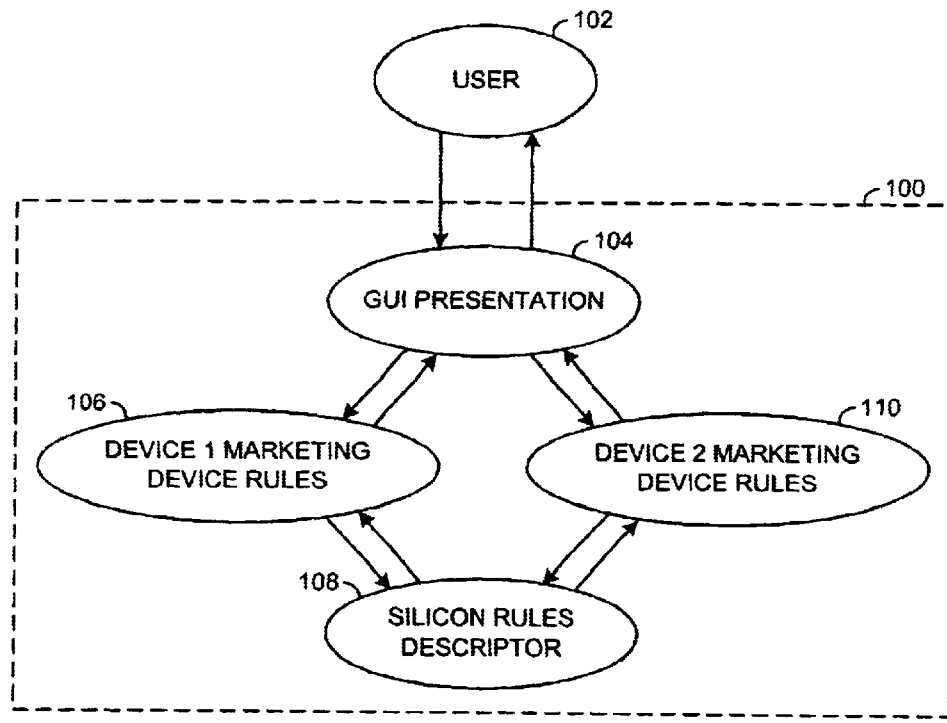
FIG. 2 is a diagram illustrating a method for developing a specification according to the present invention.

Referring to FIG. 2, a diagram illustrating a method 100 for developing a specification for a new device is shown in accordance with a preferred embodiment of the present invention. The method 100 generally comprises software executed by a computer and interacting with a user (or customer) 102. The method 100 generally comprises a task 104, a task 106, and a task 108. The method 100 may include one or more optional tasks 110 (only one shown for clarity). The method 100 may receive a description of the new device from the user 102. The method 100 may present the specification to the user 102 in accordance with the description.

The method 100 may describe abstract rules and behavioral characteristics of a base silicon die in a rules and behavioral class container. Characteristics of the base silicon die may be extracted from the container and the contents polymorphed to appear to the user 102 as the new device with specific marketing characteristics as determined by a datasheet offering. Marketing rules specific to the new device may be separate from silicon specific rules for the base silicon die. Multiple new devices may be polymorphed from the same base silicon die. Therefore, the silicon behavioral description may serve as a basis inherited by all new devices.

The task 104 may be implemented as a user interface task. In one embodiment, the task 104 may be implemented as a graphical user interface (GUI) presentation task. The GUI presentation 104 may receive information, data and commands from the user 102. The GUI presentation task 104 may present information and specifications to the user 102.

The task 106 may implement a set of rules relating to marketing considerations. In particular, the task 106 may be implemented as an instantiation of a marketing device rule task for a new device (e.g., device 1). The device 1 marketing device rules task 106 may receive and process information from the GUI presentation task 104. The device 1 marketing device rules task 106 may present information to the GUI presentation task 104 for display to the user 102.

The task 108 may be implemented as set of rules relating to operational and non-operational silicon device considerations. In particular, the task 108 may be implemented as a silicon rule descriptor task. The silicon rules descriptor task 108 may receive information from the device 1 marketing device rules task 106. The silicon rules descriptor task 108 may present information to the device 1 marketing device rules task 106 for polymorphing to a specification for the new device.

Task 110 may be provided to account for a second new device (e.g., device 2). The task 110 may be implemented as another instantiation of the marketing device rules task for the second device. The device 2 marketing device rules task 110 may receive and process information from the GUI presentation task 104. The device 2 marketing device rules task 110 may present information to the GUI presentation task 104 for display to the user 102. The task 106, the task 110 and any other device marketing rules tasks may operate simultaneously and work from (supported by) the same silicon rules descriptor task 108.

Figure 3:
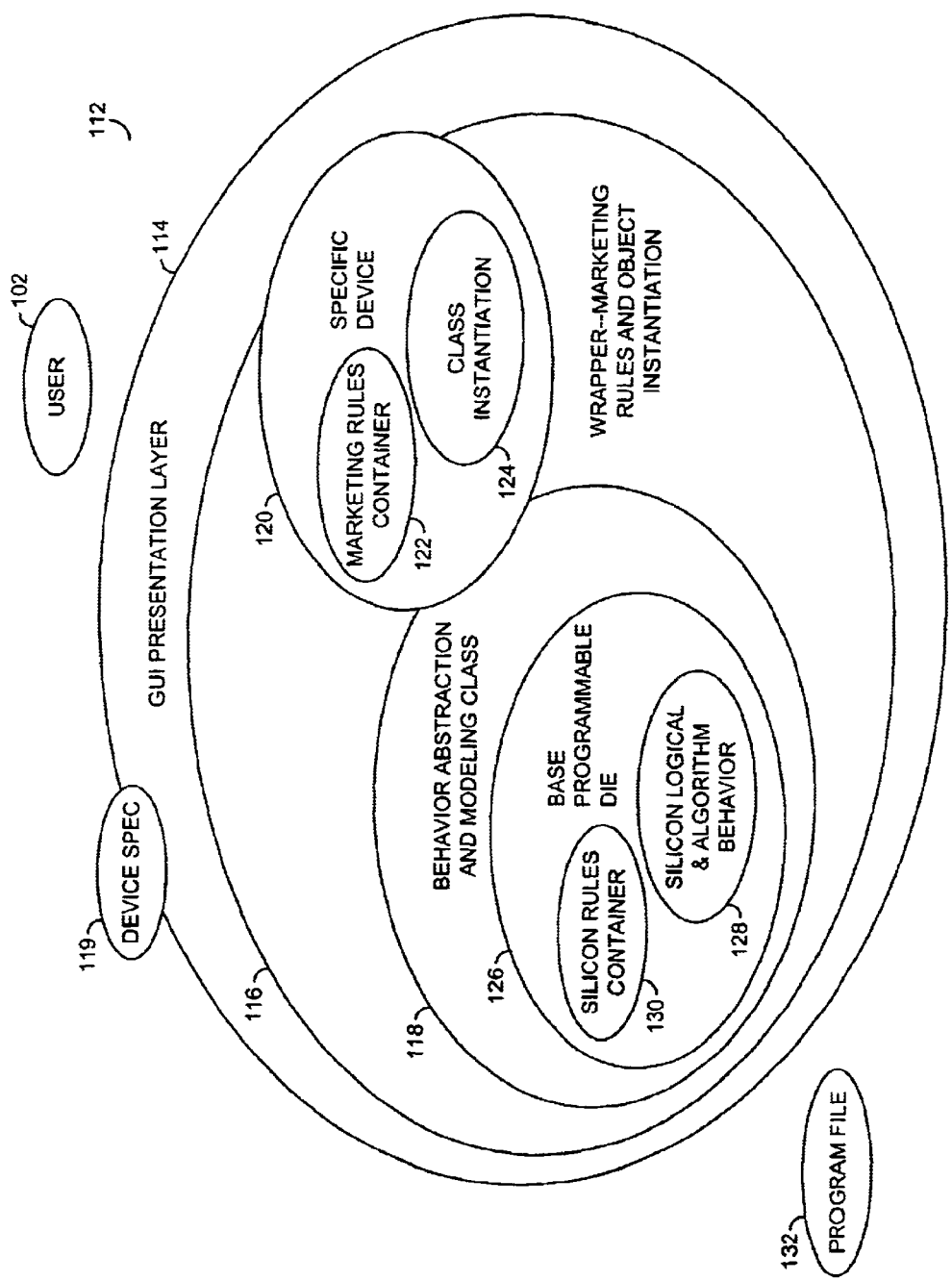
FIG. 3 is a software diagram of a system implementing the present invention.

Referring to FIG. 3, a software diagram illustrating software 112 implementing the present invention is shown. The software 112 generally comprises a class 114, class 116 and a class 118. The class 114 may be implemented as a user interface layer. In one embodiment, the class 114 may be implemented as a GUI presentation layer. The class 116 may be implemented as a wrapper layer. The class 118 may be implemented as a silicon base class.

The GUI presentation layer 114 may have an ability to present and receive data to and from the user 102. The GUI presentation layer 114 may have an ability to instruct a build or instantiation of the wrapper layer 116. Data may be exchanged between the GUI presentation layer 114 and the wrapper layer 116. The GUI presentation layer 114 may have an ability to polymorph to a datasheet type device interface wrapper class specification 119, as specified by the user 102.

The wrapper layer 116 may have an ability to receive GUI class parameters. The wrapper layer 116 may have an ability to instruct a build or instantiation of the silicon base class 118. Multiple datasheet type specific devices 120 (only one shown for clarity) may be simultaneously held by the wrapper layer 116. Each specific device 120 may have an ability to hold a rules container 122 in conjunction with the datasheet parameter specifications. Each specific device 120 may also have a class instantiation 124. The wrapper layer 116 may have an ability to polymorph the silicon base class 118. The wrapper layer 116 may filter GUI presentation layer input data and device class output data. The wrapper layer 116 may also have an ability to present data to the GUI presentation layer 114.

The silicon base class 118 may have an ability to inherent wrapper class parameters. The silicon base class 118 may also have an ability to receive computational instructions from the wrapper layer 116. Multiple base programmable die definitions 126 (only one shown for clarity) may be stored by the silicon base class 118. Each base programmable die definition 126 may have a silicon specific behavioral model 128. Each base programmable die definition may also have a silicon rules container 130. Each silicon behavioral model 128 may comprise (i) one or more abstract processes describing the necessary contents of device registers for the base programmable die and/or (ii) one or more abstract logical descriptions describing signal routing and output signal mapping. The silicon base class 118 may have an ability to maintain and execute the silicon rules container 130 independent from the silicon behavioral model 128. The silicon base class 118 may have an ability to operate and compute results of a silicon base class embodiment independent from wrapper class and/or GUI class processes. Furthermore, the silicon base class 118 may have an ability to return computed data to the wrapper layer 116.

The silicon base class 118 may be configured to generate programming files 132 for programming or flashing programmable dies. The silicon base class 118 may also be configured to read the programming files 132. In one embodiment, the programming file 132 may conform to the Joint Electron Device Engineering Council (JEDEC) standard JESD3-C, hereby incorporated by reference in its entirety. The JESD3-C standard is published by the Electronic Industries Association, Washington, D.C.

Figure 4:
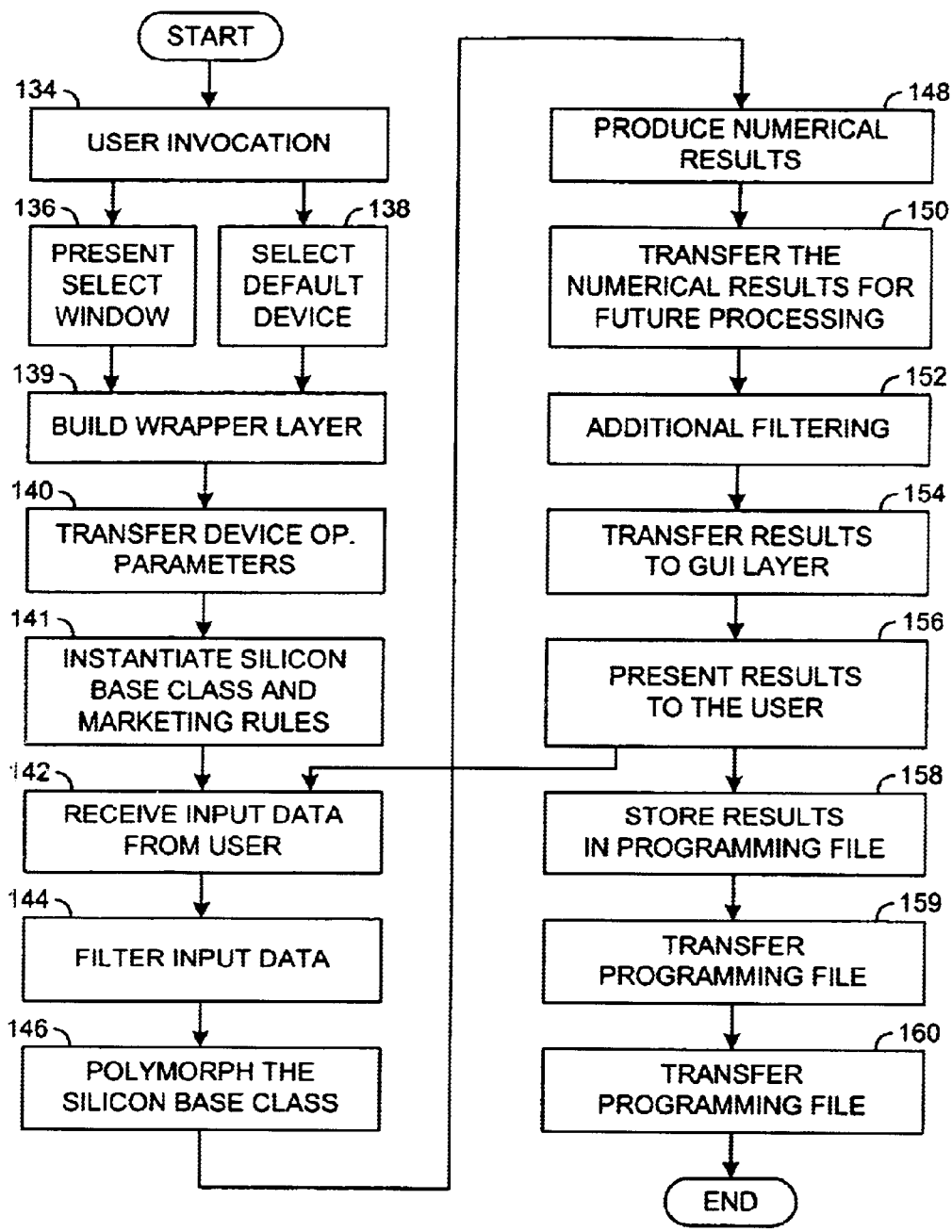
FIG. 4 is a flow diagram of the process defined by the software system.

Referring to FIG. 4, a flow diagram of a method for creating the specification for the new device is shown. The process may begin with a user invocation (e.g., block 134). The software 112 may create a user device select window in which the user 102 may be prompted to select a specific device (e.g., block 136). Alternatively, the software 112 may select a particular device by default (e.g., block 138).

Once the new device has been selected, the GUI presentation layer 114 may build or instantiate the wrapper layer 116 (e.g., block 139). The GUI presentation layer 114 may then instruct the wrapper layer 116 on device operational parameters (e.g., block 140). The wrapper layer 116, in turn, may create or instantiate the silicon base class 118 that reflects an algorithmic behavior of the silicon and logical behavioral of the base programmable die (e.g., block 141). The wrapper layer 116 may also instantiate the marketing rules behavior 122 (e.g., also block 141). Once creation of the silicon base class 118 is complete, the software 112 may be prepared for receiving input data from the user 102 (e.g., block 142).

The input data received from the user 102 may consist of one or more data fields that correlate to a customer specific definition for a particular part number for the new device. Specific rule sets (e.g., marketing device rules 106) may be employed for a limitation mapping function for the input data that reflect datasheet operational parameters and are not tied to silicon specific parameters. In essence, the limitation mapping function may be a subset of functions and performance as compared with a full silicon behavior embodiment.

Upon completion of the input data entry, a single press of a "Calculate" button may instruct the wrapper layer 116 to filter all user GUI presentation layer 114 based data for datasheet consistency and pass the results to the silicon base class 118 (e.g., block 144). The wrapper layer 116 may then function to polymorph the silicon base class 118 to create an appearance of the datasheet specification 119 (e.g., block 146).

The silicon base class 118 may be governed by rules and regulations imposed by a base programmable die specification that operates independently to the marketing rules set 106 imposed by the wrapper layer 116. The rules and regulations may be contained in the silicon rules container 130. The silicon rules container 130 may describe a full embodiment of silicon rules and behavior and may not be specific to the base programmable die.

Abstract algorithms describing the base programmable die may be instructed to produce numerical results (e.g., block 148). The numerical results may be used to specify register locations within the base programmable die. The numerical results may not be limited to one result, rather, multiple bit combination results may be generated. The results information may be passed back to the wrapper layer 116 for further processing (e.g., block 150). Abstract silicon logical modeling may be used to specify user post signal processing and signal routing. The user post signal processing and signal routing information may be passed back to the wrapper layer 116 for further processing (e.g., also block 150).

Data being accepted at the wrapper layer 116, as processed and passed back from the base silicon class 118, may be further filtered to ensure that all generated results fall within the datasheet specification 119 (e.g., block 152). Once the filtering has been accomplished, data content may be fed to the GUI presentation layer 114 (e.g., block 154) and presented to the user 102 (e.g., block 156). The process may return to the input data step 142 and repeat any number of times until the appropriate input and output device parameters for the new device are met to the satisfaction of the user 102. Once the user 102 is satisfied, the results may be stored through means of a JEDEC file format in the programming file 132 (e.g., block 158).

The JEDEC file format may allow the user 102 to download the contents of the programming file 132 to a vendor approved device programer (e.g., block 159). The device programmer may "flash" the contents into a permanent memory array of the base programmable die (e.g., block 160). The contents of the programming file 132 may not be limited to nonvolatile programming solutions, rather, volatile programming solutions may be employed through "in-system" programmability. An example of a base programmable die that may be programmed by the programming filed 132 may be a programmable phase-locked loop device. The user 102 may define a routing of signals to pins, an output frequency and an output frequency post divide factor for the programmable phase-locked loop device.

The present invention may efficiently and effectively address marketing strategies by creating an appearance of multiple new devices in the marketplace when just one die has been engineered. Proper design propagation may be enhanced whereby information in the silicon base class 118 may be propagated to the wrapper layer 116. Software development time may be reduced by focusing only on wrapper layer development for device rules behavior and description. Testing time may be substantially reduced because the silicon base class 118 may be tested once for exactness and subsequent regression testing may be limited to wrapper layer testing. It will be apparent to those of ordinary skill in the art that the present invention may also be used to optimize board rules and mask fabrication rules in manufacturing.

The function performed by the flow diagram of FIG. 4 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, by interconnecting an appropriate network of conventional component circuits, or similar apparatus as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

What is claimed is:

1. A method for creating a specification for a device, comprising the steps of:

(A) creating a base class having a first rule set for a programmable die;

(B) filtering a definition for said device against a second rule set to present a result; and (C) polymorphing said base class according to said result to present said specification for said device.

2. The method according to claim 1, further comprising the steps of:

filtering a second definition for a second device against said second rule set to present a second result; and polymorphing said base class according to said second result to present a second specification for said second device.

3. The method according to claim 2, wherein said base class supports a plurality of devices simultaneously.

4. The method according to claim 1, further comprising the step of converting said specification into a programming file for said programmable die.

5. The method according to claim 1, further comprising the step of creating a wrapper layer prior to creating said base class.

6. The method according to claim 5, further comprising the step of processing said base class independently from said wrapper layer.

7. The method according to claim 5, further comprising the step of creating a user interface layer prior to creating said wrapper layer.

8. The method according to claim 7, further comprising the step of processing said base class independently from said user interface layer.

9. The method according to claim 7, further comprising the steps of:

storing said first rule set in a first container within said base class; and storing said second rule set in a second container within said wrapper layer.

10. The method according to claim 1, wherein said base class includes a model defining at least one of (i) a register description and (ii) a signal route description.

11. A storage medium for use in a computer for creating a specification for a device, the storage medium recording a computer program that is readable and executable by the computer, the computer program comprising:

(A) creating a base class having a first rule set for a programmable die;

(B) filtering a definition for said device against a second rule set to present a result; and (C) polymorphing said base class according to said result to present said specification for said device.

12. The computer program according to claim 11, wherein said computer program further comprises the steps of:

filtering a second definition for a second device against said second rule set to present a second result; and polymorphing said base class according to said second result to present a second specification for said second device.

13. The computer program according to claim 12, wherein said base class supports a plurality of devices simultaneously.

14. The computer program according to claim 11, wherein said computer program further comprises the step of converting said specification into a programming file for said programmable die.

15. The computer program according to claim 11, wherein said computer program further comprises the step of creating a wrapper layer prior to creating said base class.

16. The computer program according to claim 15, wherein said computer program further comprises the step of processing said base class independently from said wrapper layer.

17. The computer program according to claim 15, wherein said computer program further comprises the step of creating a user interface layer prior to creating said wrapper layer.

18. The computer program according to claim 17, wherein said computer program further comprises the step of processing said base class independently from said user interface layer.

19. The computer program according to claim 17, wherein said computer program further comprises the steps of:

storing said first rule set in a first container within said base class; and storing said second rule set in a second container within said wrapper layer.

20. A circuit comprising:

means for creating a base class having a first rule set for a programmable die;

means for filtering a definition for a device against a second rule set to present a result; and means for polymorphing said base class according to said result to present a specification for said device.

* * * * *